United States Patent
Balakrishnan

(10) Patent No.: US 6,731,467 B1
(45) Date of Patent: May 4, 2004

(54) TRACE INTERCONNECT ARRAY HAVING INCREASED BANDWIDTH BY SELECTIVE ETCHING OF TRACES AND DIELECTRIC SUBSTRATE

(75) Inventor: Arun Balakrishnan, Lafayette, CO (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 10/302,533

(22) Filed: Nov. 21, 2002

Related U.S. Application Data

(63) Continuation of application No. 09/324,576, filed on Jun. 2, 1999, now Pat. No. 6,487,047.

(51) Int. Cl.[7] .............................................. G11B 5/48
(52) U.S. Cl. ................................................. 360/245.8
(58) Field of Search .......................... 360/245.8, 264.4, 360/245.9, 246, 234.5; 430/319; 438/631, 638; 493/416

(56) References Cited

U.S. PATENT DOCUMENTS

| | | | |
|---|---|---|---|
| 5,001,583 A | * 3/1991 | Matsuzaki ............... 360/234.5 |
| 5,666,717 A | 9/1997 | Matsumoto et al. ..... 29/603.12 |
| 5,680,274 A | 10/1997 | Palmer .................... 360/245.9 |
| 5,687,479 A | 11/1997 | Bennin et al. ................. 29/885 |
| 5,712,749 A | 1/1998 | Gustafson .................... 360/246 |
| 5,717,547 A | 2/1998 | Young ......................... 360/246 |
| 5,737,152 A | 4/1998 | Balakrishnan ........... 360/245.9 |
| 5,754,369 A | 5/1998 | Balakrishnan ........... 360/264.2 |
| 5,796,552 A | 8/1998 | Akin, Jr. et al. ......... 360/264.2 |
| 5,809,634 A | 9/1998 | Inaba ........................ 29/603.4 |
| 5,812,344 A | 9/1998 | Balakrishnan ........... 360/245.9 |
| 5,844,753 A | 12/1998 | Inaba ...................... 360/264.2 |
| 5,854,724 A | 12/1998 | Inaba et al. .............. 360/245.9 |
| 5,933,293 A | 8/1999 | Bennin .................... 360/264.2 |
| 5,955,176 A | 9/1999 | Erpelding et al. .......... 428/209 |
| 5,978,177 A | 11/1999 | Takasugi ................. 360/245.9 |
| 5,982,584 A | 11/1999 | Bennin et al. ........... 360/235.4 |
| 5,986,853 A | 11/1999 | Simmons et al. ........ 360/245.9 |
| 5,995,329 A | 11/1999 | Shiraishi et al. ......... 360/245.9 |
| 6,004,473 A | 12/1999 | Hsiao et al. ................... 216/22 |
| 6,028,748 A | 2/2000 | Kuroe et al. ................ 360/110 |
| 6,035,530 A | 3/2000 | Hong ........................... 29/885 |
| 6,146,813 A | * 11/2000 | Girard et al. ............... 430/319 |
| 6,282,064 B1 | 8/2001 | Palmer et al. ........... 360/245.9 |
| 6,326,301 B1 | * 12/2001 | Venkatesan et al. ........ 438/638 |
| RE37,869 E | * 10/2002 | Suzuki ..................... 360/97.01 |
| 6,475,903 B1 | * 11/2002 | Gardner ...................... 438/631 |

\* cited by examiner

*Primary Examiner*—Tianjie Chen
(74) *Attorney, Agent, or Firm*—James P. Broder; Steven G. Roeder

(57) ABSTRACT

A tall-electrode trace interconnect array includes a dielectric support substrate for supporting least two tall-electrode trace conductors. A dielectric support structure on the support substrate supports outside longitudinal walls of the two tall-electrode trace conductors. The dielectric support structure is formed to be absent from a longitudinal space between the two tall-electrode trace conductors thereby defining an ambient air dielectric to reduce and control inter-electrode capacitance and increase resonant frequency and effective electrical bandwidth of the trace interconnect array. A method for forming the array is also disclosed.

27 Claims, 6 Drawing Sheets

| Dim. A (μm) | Dim. B (μm) | Dim. C (μm) | Dim. D (μm) | R (100 MHz) (Ω/m) | Cc (pF/m) | Cc (45 mm) (pF) | Cg (pF/m) | Cg (45 mm) (pF) | Ceq (pF) | Ceq (45 mm) (pF) | L (100 MHz) (μH/m) | L (100 MHz) (ηH) | Res. Freq. (MHz) |
|---|---|---|---|---|---|---|---|---|---|---|---|---|---|
| 1 | 5.0 | 5 | 5 | 5 | 237.01 | 85.16 | 3.83 | 46.48 | 2.09 | 108.40 | 4.88 | 0.2363 | 10.63 | 698.81 |
| 2 | 5.0 | 5 | 6 | 5 | 226.59 | 79.69 | 3.59 | 47.17 | 2.12 | 103.28 | 4.65 | 0.2500 | 11.25 | 696.05 |
| 3 | 4.5 | 6 | 5 | 5 | 249.01 | 80.09 | 3.60 | 45.81 | 2.06 | 103.00 | 4.63 | 0.2449 | 11.02 | 704.21 |
| 4 | 4.0 | 7 | 5 | 5 | 262.43 | 75.48 | 3.40 | 45.75 | 2.06 | 98.36 | 4.43 | 0.2537 | 11.42 | 708.03 |
| 5 | 3.5 | 8 | 5 | 5 | 277.50 | 72.32 | 3.25 | 46.95 | 2.11 | 95.80 | 4.31 | 0.2618 | 11.78 | 706.24 |
| 6 | 3.0 | 9 | 5 | 5 | 294.50 | 68.29 | 3.07 | 45.69 | 2.06 | 91.14 | 4.10 | 0.2705 | 12.17 | 712.33 |
| 7 | 2.5 | 10 | 5 | 5 | 313.93 | 65.47 | 2.95 | 45.68 | 2.06 | 88.31 | 3.97 | 0.2791 | 12.56 | 712.40 |
| 8 | 2.0 | 11 | 5 | 5 | 336.16 | 64.01 | 2.88 | 45.67 | 2.06 | 86.85 | 3.91 | 0.2878 | 12.95 | 707.44 |
| 9 | 1.5 | 12 | 5 | 5 | 361.19 | 62.68 | 2.82 | 45.59 | 2.05 | 85.48 | 3.85 | 0.2973 | 13.38 | 701.60 |
| 10 | 1.0 | 13 | 5 | 5 | 391.99 | 60.35 | 2.72 | 45.65 | 2.05 | 83.18 | 3.74 | 0.3091 | 13.91 | 697.53 |
| 11 | 0.5 | 14 | 5 | 5 | 427.54 | 59.51 | 2.68 | 45.54 | 2.05 | 82.28 | 3.70 | 0.3230 | 14.54 | 686.06 |
| 12 | 0.0 | 15 | 5 | 5 | 469.99 | 57.48 | 2.59 | 45.65 | 2.05 | 80.31 | 3.61 | 0.3424 | 15.41 | 674.48 |

*FIG. 4*

| Dim. E (μm) | Cc (pF/m) | Cc (45 mm) (pF) | Cg (pF/m) | Cg (45 mm) (pF) | Ceq (pF) | Ceq (45 mm) (pF) | L (100 MHz) (μH/m) | L (100 MHz) (ηH) | Resonant Frequency (MHz) |
|---|---|---|---|---|---|---|---|---|---|
| 0 | 84.09 | 3.78 | 45.80 | 2.06 | 106.99 | 4.81 | 0.2356 | 10.60 | 704.45 |
| 5 | 102.33 | 4.60 | 49.27 | 2.22 | 126.97 | 5.71 | 0.2356 | 10.60 | 646.66 |
| 10 | 120.07 | 5.40 | 49.88 | 2.24 | 145.01 | 6.53 | 0.2356 | 10.60 | 605.09 |
| 15 | 149.69 | 6.74 | 49.98 | 2.25 | 174.68 | 7.86 | 0.2356 | 10.60 | 551.31 |
| 20 | 165.03 | 7.43 | 50.01 | 2.25 | 190.04 | 8.55 | 0.2356 | 10.60 | 528.57 |
| 25 | 185.19 | 8.33 | 50.05 | 2.25 | 210.22 | 9.46 | 0.2356 | 10.60 | 502.56 |
| 30 | 192.87 | 8.68 | 50.65 | 2.28 | 218.20 | 9.82 | 0.2356 | 10.60 | 493.28 |
| 35 | 202.47 | 9.11 | 50.96 | 2.29 | 227.95 | 10.26 | 0.2356 | 10.60 | 482.61 |

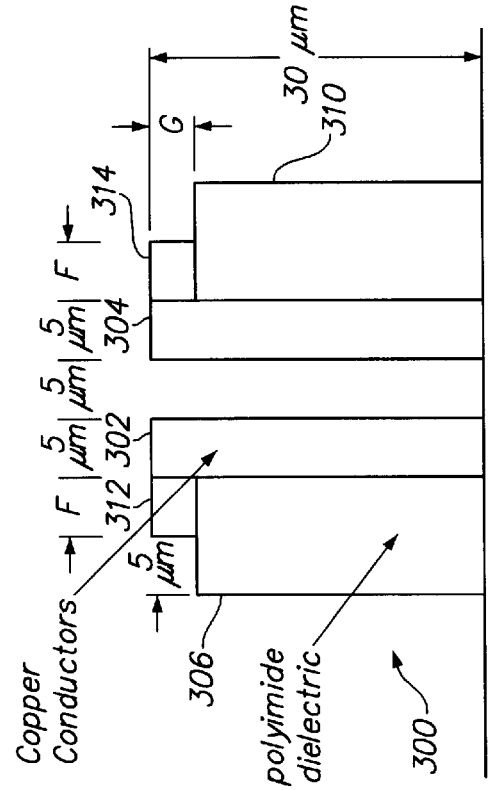
FIG. 11
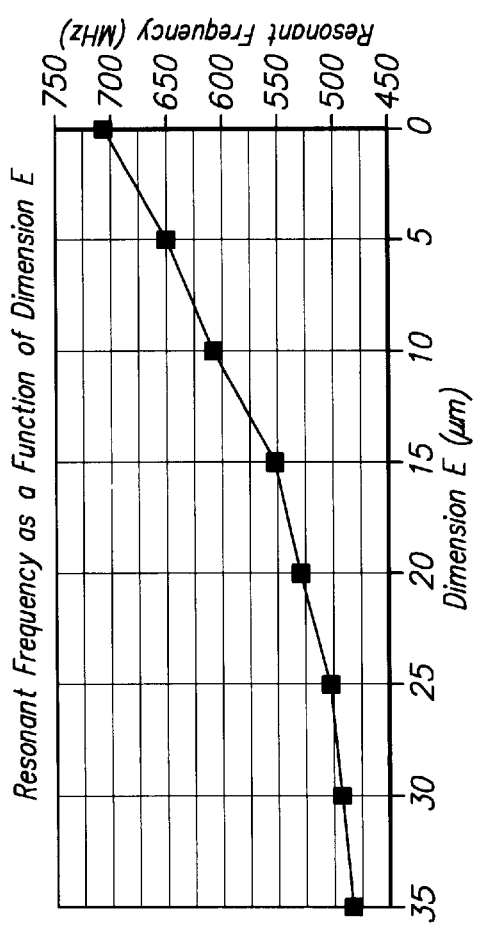
FIG. 10
FIG. 12
| Dim. | Dim. | R | Cc | Cc | Cg | Cg | Ceq | Ceq | L | L | Resonant Frequency |
|---|---|---|---|---|---|---|---|---|---|---|---|
| F (μm) | G (μm) | (100 MHz) (Ω/m) | (pF/m) | (45 mm) (pF) | (pF/m) | (45 mm) (pF) | | (45 mm) (pF) | (100 MHz) (μH/m) | (100 MHz) (nH) | (MHz) |
| 1 | 7.5 | 5 | 211.30 | 87.30 | 3.93 | 56.19 | 2.53 | 115.39 | 5.19 | 0.2326 | 10.47 | 682.68 |
| 2 | 10.0 | 5 | 204.30 | 88.38 | 3.98 | 57.27 | 2.58 | 117.02 | 5.27 | 0.2325 | 10.46 | 678.07 |
| 3 | 10.0 | 6 | 184.05 | 87.72 | 3.95 | 58.03 | 2.61 | 116.73 | 5.25 | 0.2459 | 11.07 | 660.13 |
| 4 | 15.0 | 7 | 169.72 | 91.64 | 4.12 | 60.71 | 2.73 | 121.99 | 5.49 | 0.2533 | 11.40 | 636.25 |
| 5 | 15.0 | 8 | 205.77 | 84.38 | 3.80 | 61.00 | 2.75 | 114.88 | 5.17 | 0.2469 | 11.11 | 664.09 |

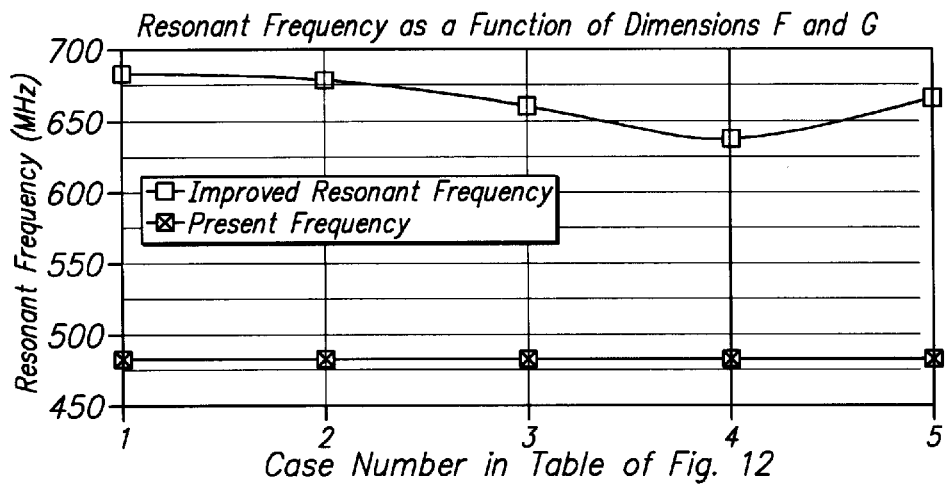
FIG. 13
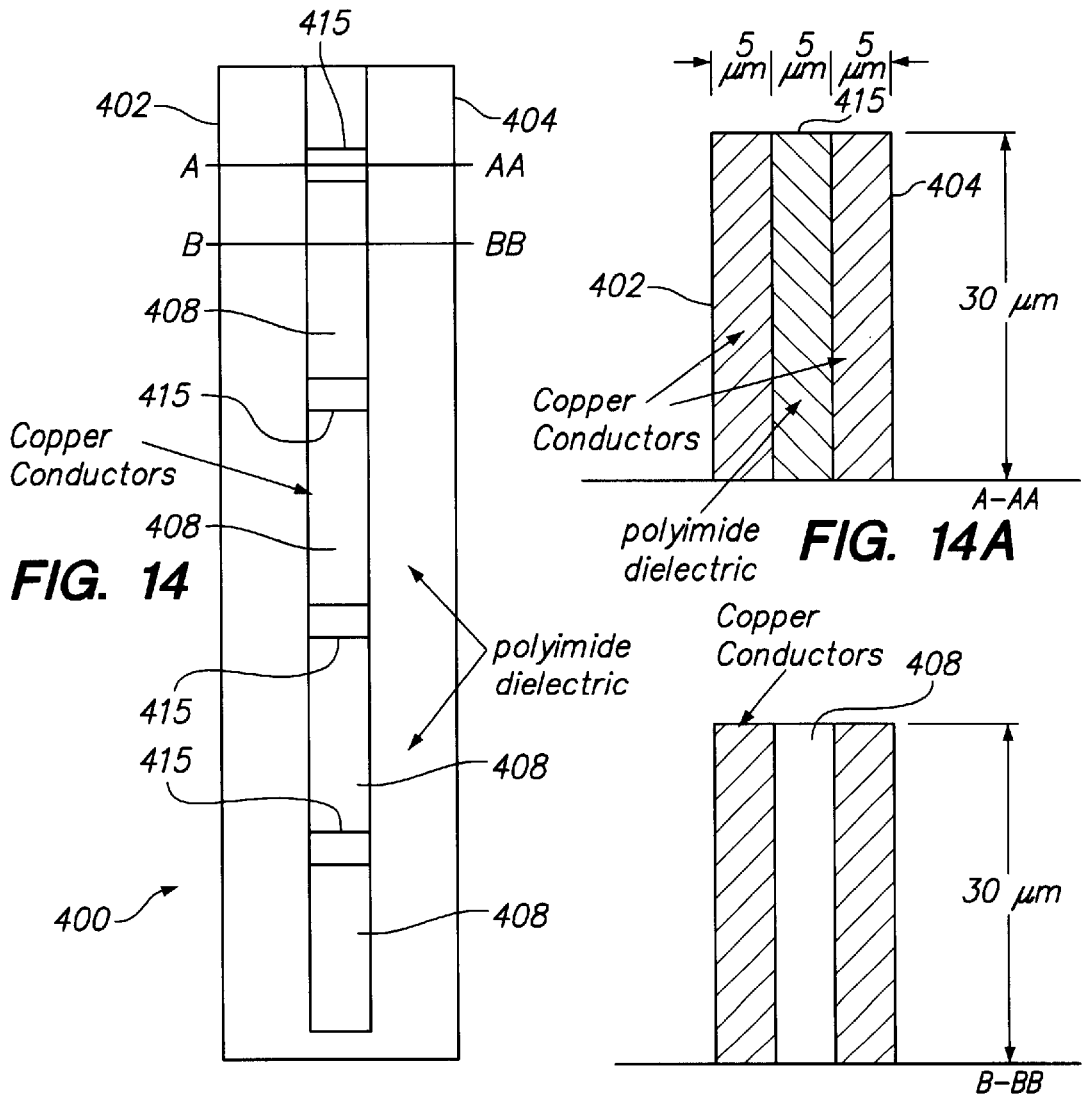
FIG. 14
FIG. 14A
FIG. 14B

TRACE INTERCONNECT ARRAY HAVING INCREASED BANDWIDTH BY SELECTIVE ETCHING OF TRACES AND DIELECTRIC SUBSTRATE

REFERENCE TO RELATED APPLICATION

This is a continuation application of U.S. patent application Ser. No. 09/324,576, now U.S. Pat. No. 6,487,047B1, filed on Jun. 2, 1999, and entitled: "TRACE INTERCONNECT ARRAY HAVING INCREASED BANDWIDTH BY SELECTIVE ETCHING OF TRACES AND DIELECTRIC SUBSTRATE". This application claims priority of co-pending U.S. patent application Ser. No. 09/324,576, under 35 U.S.C. §120. The contents of U.S. patent application Ser. No. 09/324,576 are incorporated herein by reference.

FIELD OF THE INVENTION

The present invention relates to flex circuits for connecting magnetic heads to read and write circuits of a magnetic recording device. More particularly, the present invention relates to a trace interconnect array manifesting controlled inductance, capacitance and high frequency resistance in order to provide increased bandwidth and a process for making the array have the desired electrical characteristics by selective etching of conductive traces and adjacent dielectric materials.

BACKGROUND OF THE INVENTION

Contemporary mass storage devices such as magnetic hard disk drives present a data transducer in a confronting relationship with a relatively moving data storage medium. Magnetic flux transitions are written to, or read from the medium. Disk drives typically include a rotating rigid storage disk having at least one major surface carrying a deposition or coating of magnetic material. A head positioner, commonly referred to as an actuator, positions the data transducer at selected radial storage track locations of the disk. In-line rotary voice coil actuators are presently preferred because of their simplicity and high performance characteristics, due in substantial part to intrinsic mechanical rigidity and a characteristic of being mass balanced about an axis of rotation relative to a drive base. A closed-loop servo system within the disk drive controls a voice coil motor of the actuator in order to position the transducer head at each desired disk radial location during track following operations and to move the transducer among radial locations during track seeking operations.

The read/write transducer head of a magnetic hard disk drive is typically a dual element design and is selectively deposited by thin film deposition upon a ceramic slider having a portion defining an air bearing surface for supporting the transducer at a very small distance away from the disk surface upon an air bearing present during disk rotation. One element of the transducer is typically a thin-film inductive write element. The other element of the transducer is typically a magnetoresistive (MR) sensor. A flux transition field of a recorded data pattern proximate to the MR sensor causes a miniscule change in electrical resistance of the sensor. Change of resistance in the presence of a constant current flowing through the sensor results in a minute voltage change, on the order of 3–5 millivolts, and this voltage change, representing a data pattern, is amplified by a preamplifier. Since the sensed signal (read signal) is so small, care must be taken to reduce extraneous noise pickup along a circuit between the read sensor and the preamplifier.

A head suspension extending from the actuator includes a load beam and a gimbal or flexure. The load beam includes a spring portion which applies a desired preload force to the slider which biases the slider toward the disk surface. This preload or bias force is overcome by airflow resulting from disk rotation and the formation of the desired air bearing between the slider and the adjacent disk surface. The gimbal enables the slider to follow the contour of the disk in order to maintain constant a very small spacing, on the order of one half to several microinches, between the transducer and the storage surface.

In the past, very small diameter twisted solid copper wires have typically been used to connect head elements at the slider to other signal carrying and signal processing elements of the disk drive located on or adjacent to the actuator structure. The two-conductor twisted pair service loop is inherently self-shielding from external noise sources such as electromagnetic interference (EMI) and radio frequency interference (RFI) by virtue of the fact that the conductors are twisted around each other. Coaxial transmission line cables are also inherently self-shielding, but the center conductor is electrically unbalanced with respect to the outer cylindrical shield conductor. Two-conductor balanced coaxial transmission lines avoid this drawback but are typically too bulky and cumbersome to be used to connect to the write/read elements of the very small sliders in present use in hard disk drives. One drawback of wires and cables is that they can apply an unwanted bias force to the slider supporting structure. Another drawback of discrete wires is that their electrical characteristics are not precisely controllable.

To reduce unwanted drawbacks of discrete wire conductors and cables, head suspensions having integrated trace arrays have recently been adopted in disk drive designs. These designs have typically included a stainless steel flexure upon which conductor structures have been formed by selective deposition/removal of dielectric material and conductor material. As formed the trace conductors of a service loop extend longitudinally from the transducer element to an interconnect or a preamplifier/write driver circuit. One example of a preferred method for manufacturing a magnetic head suspension with integrated trace array wiring is described in U.S. Pat. No. 5,666,717 to Matsumoto et al., entitled: "Method for Manufacturing a Magnetic Head Suspension", the disclosure thereof being incorporated herein by reference.

Because the conductive traces of a service loop are typically formed in a side-by-side arrangement on a dielectric layer or substrate of the trace array, the traces essentially form an open-wire or micro-strip transmission line. Microstrip line technology teaches that the loop and interconductor capacitance may be changed by changing the dimensions of and/or spacing between micro strips forming a transmission line. In the case of integrated trace array wiring designs for use within, or as part of, head suspension assemblies of hard disk drives, the dimensions of conductors and dielectric substrates may be governed more by mechanical constraints rather than by desired electrical characteristics.

Disk drive technology is continually seeking ways to increase storage capacity and performance of hard disk drives. One way to increase performance, as noted above, is to make write/read elements very small, and to reduce the size of sliders and head suspension assemblies, thereby reducing overall actuator mass and reducing average seeking operation time. One way to increase capacity is to make track widths narrower, so that more tracks may be defined in a unit storage area. Yet another way to increase capacity is to increase linear data density as by increasing data transfer rates, for example. With increased data transfer rates, care must be taken to ensure that the interconnect structure and electrical service loop between head and preamplifier has sufficient bandwidth margin to support the higher data transfer rate. One parameter which limits the bandwidth of a head interconnect service loop is impedance, which in turn depends upon inductance and capacitance characteristics of the interconnect structure.

One known way to reduce losses and noise pickup caused by the interconnect is to make the interconnect as short in length as possible. This approach requires locating some or all of the preamplifier electronics as close to the read element of the head as possible. This usually means mounting and connecting an integrated circuit chip directly onto the head suspension, a so-called "chip-on-suspension" or COS approach. The COS approach has its own drawbacks, such as chip heat dissipation and electrical supply requirements and characteristics, issues which have not yet been fully developed and resolved.

FIG. 1 shows a present-day trace interconnect array 10. This exemplary trace interconnect array 10 typically consists of two trace conductors for each read or write channel of the head. The FIG. 1 enlarged cross-sectional view shows that the array 10 essentially comprises two copper conductor traces 12 and 14 separated from a stainless-steel substrate 16 by a dielectric layer 18 of polyimide, epoxy resin, acrylic resin, or other suitable polymeric dielectric material. The substrate 16 is typically of thin stainless steel sheet material and is formed into a load beam or flexure portion of a head suspension. A non-conductive overcoat 20 also typically covers and encapsulates the two conductors 12 and 14 (except at terminal locations) to prevent direct electrical or ambient atmospheric contact with either conductor. The overcoat 20 may be of polyimide, epoxy resin, acrylic resin or other suitable polymeric dielectric material. The trace interconnect array 10 may be formed in accordance with the process steps outlined in the referenced U.S. Pat. No. 5,666,717, incorporated hereinabove.

Capacitive coupling of each conductor 12, 14 to the metal substrate 16 depends upon the distance each conductor is placed above the substrate, and the dielectric properties of the layer 18, as well as confronting surface areas of the conductor surfaces facing the metal substrate. Inter-electrode capacitance depends upon the height of the facing walls of each trace conductor and the gap dimension between the two trace conductor facing walls, as well as the dielectric properties of portion of overcoat 20 filling the gap between the two facing walls of conductors 12 and 14. In the FIG. 1 prior art example 10, inter-electrode capacitance has a smaller value than an electrode-to-substrate capacitance value.

Several approaches have been proposed to reduce trace conductor-to-substrate capacitance for side-by-side trace conductor arrays generally of the type shown in FIG. 1. One approach is described in U.S. Pat. No. 5,712,749 to Gustafson, entitled: "Reduced Capacitance of Electrical Conductor on Head Suspension Assembly". The '749 patent teaches placement of a trace conductor pair onto a dielectric-coated stainless steel load beam. The load beam is provided with apertures, openings or discontinuities in alignment with longitudinal sections of the trace conductor pair. By aligning the trace conductor pair with such apertures, openings or discontinuities, capacitance between each conductor and the steel load beam substrate is somewhat reduced or otherwise can be somewhat controlled.

Another prior approach to reduce trace-to-load-beam capacitance is described in U.S. Pat. No. 5,687,479 to Bennin et al., entitled: "Electrical Trace Interconnect Assembly". The '479 approach is to form a discrete two-conductor side-by-side trace array of spring-like beryllium copper alloy and suspend the array above the stainless steel load beam upon insulator standoffs. The trace conductors thereby are suspended slightly away from the facing surface of a metal load beam, in part by an air dielectric, thereby decreasing capacitance between each conductor and the stainless-steel load beam.

Other efforts to control electrical properties of side-by-side trace conductor arrays have been described in commonly assigned U.S. Pat. No. 5,717,547 to Young, entitled: "Multi-Trace Transmission Lines for R/W Head Interconnect in Hard Disk Drive"; U.S. Pat. No. 5,737,152 to Balakrishnan, entitled: "Suspension with Multi-Layered Integrated Conductor Trace Array for Optimized Electrical Parameters"; U.S. Pat. No. 5,754,369 to Balakrishnan, entitled: "Head Suspension with Self-Shielding Integrated Conductor Trace Array"; and, U.S. Pat. No. 5,812,344 to Balakrishnan, entitled: "Suspension with Integrated Conductor Trace Array Having Optimized Cross-Sectional High Frequency Current Density".

The disclosures of the foregoing U.S. Patents are hereby incorporated by reference into this patent as pertinent background information.

Even more recently it has been proposed to increase the height-to-width ratio of integrated trace conductors of an interconnect array. An example of this later proposal is depicted in FIG. 2. A side-by-side trace array 30 includes trace conductors 32 and 34 above a stainless-steel load beam substrate 36. The conductors 32 and 34 are formed on a dielectric layer 38, and a dielectric overcoat 40 encapsulates the conductors and fills a narrow gap between the facing sidewalls of the conductors. In the FIG. 2 array 30, the trace conductors 32 and 34 have a height-to-width ratio which reduces the width dimension and the conductor-to-substrate capacitance, at the expense of increasing the height dimension and inter-conductor capacitance. The inter-electrode capacitance of the array 30 is directly a function of the surface areas, and separation distance, of the two facing sidewalls of the conductors 32 and 34, and of the dielectric properties of the overcoat material 40.

While it might be proposed to remove the dielectric overcoat 40 completely, such proposal carries a considerable risk that the trace conductors 32 and 34 will become shorted together and cease to function effectively as a service loop, or become corroded or mechanically delaminated from the underlying dielectric layer 38. Therefore, a hitherto unsolved need has remained to provide a tall electrode trace conductor array having increased bandwidth, as typically characterized by reduced inter-electrode capacitance.

SUMMARY OF THE INVENTION WITH OBJECTS

The present invention provides methods and structures to increase the bandwidth characteristics of a flexible trace conductor array, for use within a data storage device having a high transfer rate, such as a magnetic hard disk drive.

One object of the present invention is to provide a tall electrode trace conductor interconnect array which manifests reduced inter-electrode capacitance while maintaining mechanical integrity within a flexible interconnect structure of a head suspension of a hard disk drive in a manner overcoming limitations and drawbacks of prior approaches.

In accordance with one aspect of the principles of the present invention, a trace interconnect array is provided for electrically interconnecting a write or read element of a data transducer head respectively to a write driver circuit or read preamplifier circuit of a storage device, such as a magnetic hard disk drive or a magnetic tape drive. The trace interconnect array includes a dielectric support substrate which may be a flexible plastic film material, or which may be formed as part of a head suspension. At least two tall-electrode trace conductors are formed e.g. by selective electrochemical deposition onto the support substrate. A dielectric support structure is also formed on the support substrate and supports outside longitudinal walls of the two tall-electrode trace conductors. The dielectric support structure is formed as not to be substantially present in a longitudinal space separating the two tall-electrode trace conductors in order to reduce and control inter-electrode capacitance and thereby increase the resonant frequency and effective electrical bandwidth of the trace interconnect array. Preferably, the dielectric support structure is formed by selective etching or another selective material removal process in order to define and provide the air-dielectric space between the two tall-electrode trace conductors.

In one example of the invention, facing walls of the two tall-electrode trace conductors are shaped to converge toward the dielectric support substrate. In another example of the invention, the two tall-electrode trace conductors have height dimensions from the dielectric support substrate greater than a height dimension of the dielectric support structure. In a further example of the invention, the two tall-electrode trace conductors include lateral portions extending over respective adjacent portions of the dielectric support structure. In one more example of the invention, the dielectric support structure is selectively formed to define longitudinally spaced apart cross-tie structural interconnect portions between the inside walls of the tall-electrode conductors which separate longitudinally extending air dielectric spaces between the two tall-electrode trace conductors.

In one presently preferred example of the present invention, the dielectric support substrate is formed on a thin metal sheet portion of a head suspension for a magnetic hard disk drive.

In accordance with another aspect of the present invention a method is provided for making a trace interconnect array for electrically interconnecting a write or read element of a data transducer head to a write driver or read preamplifier circuit. The method essentially includes the steps of: forming a dielectric support substrate; forming at least two tall-electrode trace conductors on the support substrate; forming a dielectric support structure on the support substrate for supporting outside walls of the two tall-electrode trace conductors; and, selectively defining a longitudinally extending space between the two tall-electrode trace conductors in order to reduce inter-electrode capacitance.

These and other objects, advantages, aspects, and features of the present invention will be more fully appreciated and understood upon consideration of the following detailed description of preferred embodiments presented in conjunction with the accompanying drawings.

BRIEF DESCRIPTION OF THE DRAWINGS

In the Drawings:

FIG. 4 is a table of simulation data of electrical parameters of the FIG. 3 trace interconnect array.

FIG. 10 is a plot of resonant frequency of the FIG. 7 trace array as a function of the dielectric height dimension.

FIG. 11 is a greatly enlarged view in elevation and cross section of a third trace interconnect array formed in accordance with principles of the present invention.

FIG. 12 is a table of simulation data of electrical parameters of the FIG. 11 third trace interconnect array.

FIG. 13 is a plot of resonant frequency of the FIG. 11 third trace interconnect array as a function of dimensions F and G shown in FIG. 11.

FIG. 14 is a greatly enlarged plan view of a fourth trace array formed in accordance with principles of the present invention.

FIG. 14A is a view in elevation and cross section of the FIG. 14 fourth trace array taken along the section line A–AA in FIG. 14.

FIG. 14B is a view in elevation and cross section of the FIG. 14 fourth trace interconnect array taken along the section line B–BB in FIG. 14.

DETAILED DESCRIPTION OF PREFERRED EMBODIMENTS

In accordance with principles of the present invention, a method is provided for improving the bandwidth of tall electrode trace interconnect arrays for interconnecting transducers with data handling circuitry of data storage devices. While the present method and resultant tall electrode trace interconnect arrays are shown as part of head suspension assemblies for a magnetic hard disk drive, those skilled in the art will appreciate that the principles of the present invention may be applied to a wide variety of electrical trace interconnect arrays formed on conductive as well as non-conductive support substrates.

Figure 1:
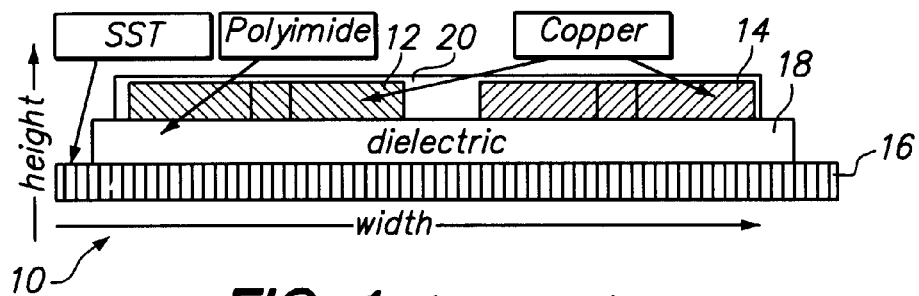
FIG. 1 is a greatly enlarged view in elevation and cross-section of a conventional two-conductor side-by-side trace interconnect array formed upon a load beam structure of a head suspension of a magnetic hard disk drive.
Figure 2:
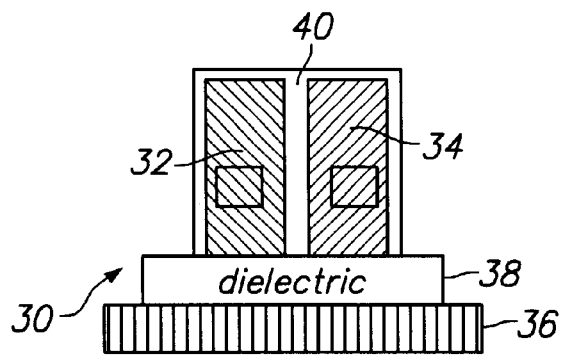
FIG. 2 is a greatly enlarged view in elevation and cross-section of another conventional tall-electrode, two-conductor side-by-side trace interconnect array in which the trace conductor electrodes have been formed to be taller than they are wide relative to the underlying support load beam structure.
Figure 3:
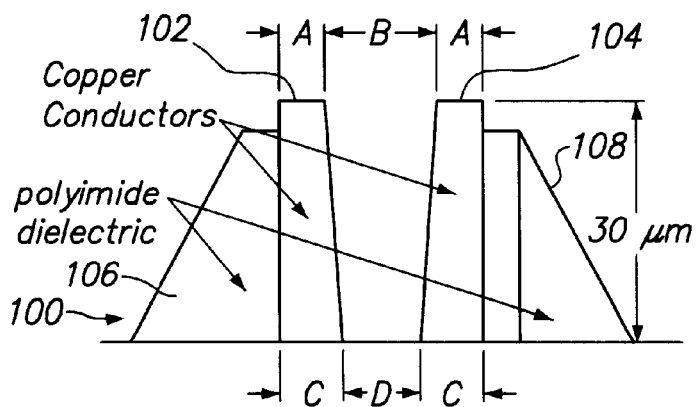
FIG. 3 is greatly enlarged view in elevation and cross-section of one example of a trace interconnect array formed in accordance with principles of the present invention.

FIG. 3 shows a first tall electrode trace interconnect array 100. The array 100 includes a dielectric supporting substrate (not shown) which may be a dielectric layer 38 and stainless steel flexure or load beam 36 shown in FIG. 2, for example. There are two tall electrode trace conductors 102 and 104, and two dielectric buttress layers 106 and 108 respectively engaging and supporting outside walls of the conductors 102 and 104. The array 100 is preferably formed in accordance with the steps set forth in the referenced U.S. Pat. No. 5,666,717. However, as a result of an additional process step, the protective dielectric overcoat 40 of the FIG. 2 array 30 is removed by selective etching from over and between the tall electrode trace conductors 102 and 104 to form the array 100 of FIG. 3. To ensure reliable support for the conductors, the inside facing walls of the conductors are over-etched so that they in effect "lean" away from each other. Also, the outer sidewalls of the tall electrode trace conductors 102 and 104 are supported by adjacently unetched dielectric buttress support walls 106 and 108 which are protected from removal during the post formation selective etch process. Since most of the electric field lines are confined to the region between the conductors, the shapes of the unetched support wall layers 106 and 108 are not critical to electrical behavior, and can be based on mechanical support and performance considerations.

Figure 5:
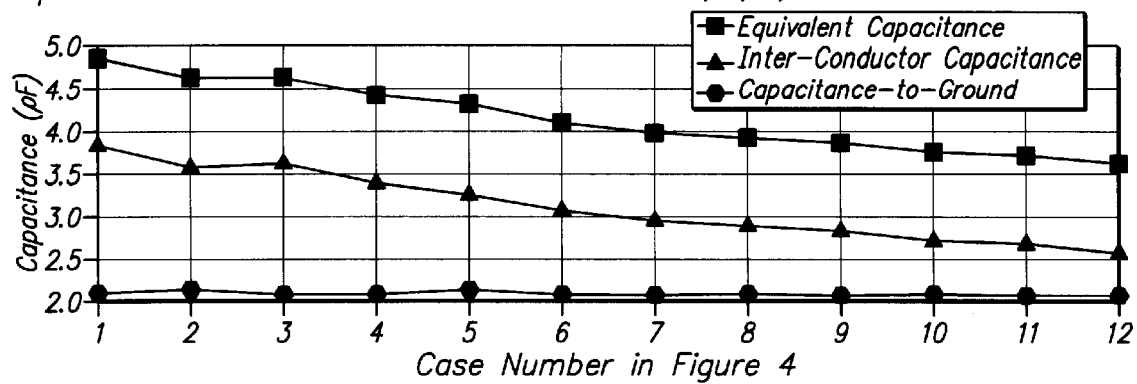
FIG. 5 is a plot of capacitance calculations from data reported in the FIG. 4 table.
Figure 6:
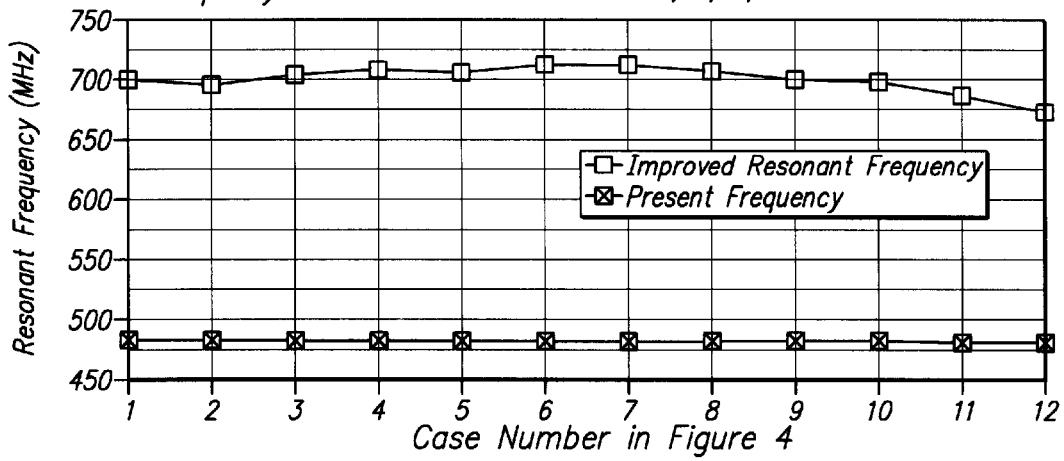
FIG. 6 is a plot of resonant frequency calculations as a function of array dimensions made from the data reported in the FIG. 4 table concerning the FIG. 3 example in comparison to resonant frequency of a conventional tall electrode trace array of the type set forth in FIG. 2.

FIG. 4 shows a summary of calculations (made on a per-unit-length basis) of resistance, inductance and capacitance for the FIG. 3 tall electrode trace interconnect array 100. For an interconnect array 100 having a length of 45 mm, the absolute values of these circuit parameters are also tabulated. The resonant frequency $f_R$ (which describes the interaction between the components comprising the interconnect only) may also be calculated in accordance with:

$$f_R = \frac{1}{2\pi\sqrt{LC}}$$

where L is the series inductance and C is the equivalent capacitance. The capacitance values and the resonant frequency of the FIG. 3 interconnect array 100 are plotted in FIGS. 5 and 6. FIG. 6 compares the resonant frequency of the FIG. 3 array 100 with the FIG. 2 array 30 having a polyimide overcoat layer 40. This comparison shows that by employing the principles of the FIG. 3 array 100, resonant frequency is increased from approximately 480 MHz to approximately 700 MHz, a highly important consideration given the fact that the design data transfer rate of data storage devices, such as magnetic hard disk drives, is constantly increasing.

The FIG. 6 resonant frequency plot is used as a measure of improvement over the FIG. 2 conventional tall electrode trace interconnect array 30, since resonant frequency is a function of the product of inductance and capacitance of the trace interconnect array. Therefore, any method that increases the resonant frequency of the trace array will do so without compromising one of these two parameters for the sake of improving the other. In general, lower values of inductance and capacitance are preferred in the trace interconnect array connecting a head read element to a preamplifier circuit. A higher value of inductance or capacitance than that normally available can always be obtained by employing known principles of design; however, lower values of inductance and capacitance are not so readily achieved.

Figure 7:
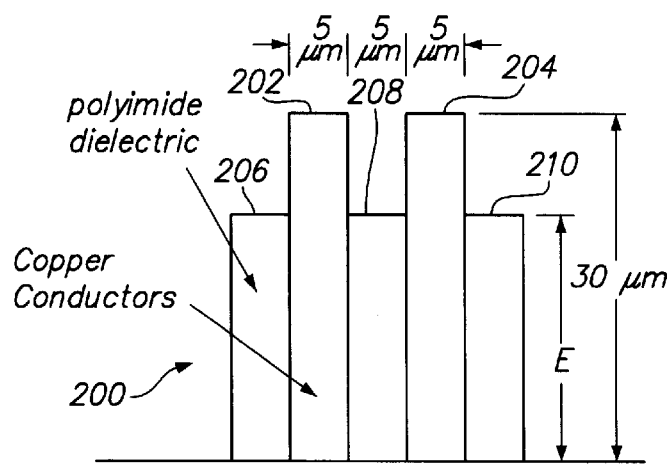
FIG. 7 is greatly enlarged view in elevation and cross-section of a second trace interconnect array formed in accordance with principles of the present invention.

FIG. 7 shows a second trace interconnect array 200 following principles of the present invention. In the FIG. 7 array 200 tall electrode conductors 202 and 204 are separated by dielectric layers 206, 208 and 210, to a height E, which is etched back to be less than the height of the conductors 202 and 204. As noted above in connection with the first trace array 100 of FIG. 3, the polyimide layers 206 and 210 on the outside of the traces 202 and 204 do not impact electrical performance of the trace array. For the sake of simplicity in manufacturing, the height of the layers 206, 208 and 210 is kept uniform. By minimizing the height dimension E by selective etching following the dielectric overcoat step during trace array manufacturing, the dielectric layer 208 between the conductors 202 and 204 is also minimized, which results in minimized inter-conductor capacitance of the array 200.

Figures 8, 9:
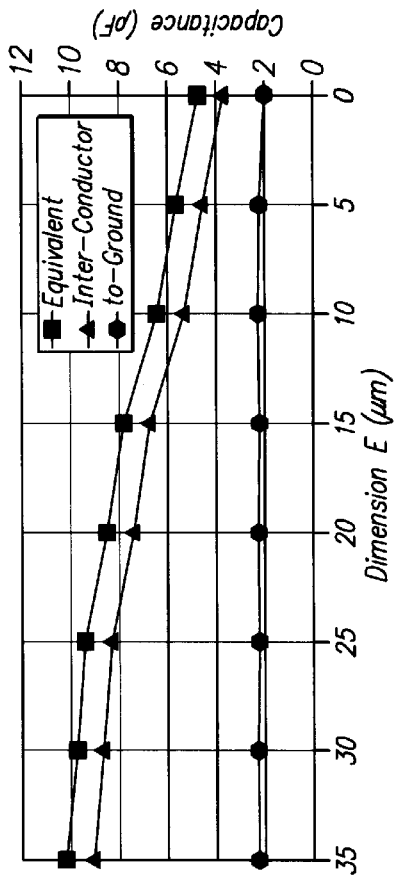
FIG. 8 is a table of simulation data of electrical parameters of the FIG. 7 trace interconnect array.
FIG. 9 is a plot of capacitance of the FIG. 7 trace array as a function of a dielectric height dimension.

FIG. 8 provides a summary of all of the calculations related to the electrical parameters of the FIG. 7 array 200. FIGS. 9 and 10 respectively show the capacitance and resonant frequency calculations for the array 200 made as a function of the dielectric height dimension E. When E is equal to 35 μm for example, the geometry of the array 200 closely approximates the conventional geometry of array 30 depicted in FIG. 2, and the resonant frequency is approximately 480 MHz. As the inter-conductor dielectric 208 height dimension E is reduced, the resonant frequency increases. When the height of dielectric layer 208 approaches zero, (no polymer dielectric in the space between the conductors 202 and 204), the resonant frequency is at a maximum of approximately 700 MHz.

FIG. 11 shows a third trace interconnect array 300 in accordance with principles of the present invention. In the method of fabrication of the FIG. 11 array 300, a height dimension of outside dielectric support layers 306 and 310 respectively adjacent outside walls of two tall electrode trace conductors 302 and 304 is fixed. Then, the tall copper electrodes 302 and 304 are extended laterally over the tops of dielectric layers 306 and 310 to form respective flange extension portions 312 and 314 during the tall electrode plate-up process. Thus, lateral extension portion 312 is part of conductor 302 and overlays support layer 306, and lateral extension portion 314 is part of conductor 304 and overlays support layer 310. Each extension has a width dimension F controlled by selective etching or milling, and has a height dimension G controlled by the electrode plate-up process.

The FIG. 12 table summarizes all of the pertinent data associated with the calculations of the resonant frequency. FIG. 13 plots the resonant frequency for five separate examples of the array 300 in comparison with the known tall trace approach shown in FIG. 2. As shown by the FIG. 13 plot, the resonant frequency of the array 300 is improved from approximately 480 MHz of the FIG. 2 array 30 to beyond approximately 625 MHz. The resonant frequency dip for example number 4 of the FIG. 12 examples is purely coincidental and is a function of the conductor geometry of this example.

In a fourth example of principles of the present invention shown in FIG. 14, a trace array 400 has a dielectric layer 408 between two tall electrode conductors 402 and 404 selectively removed, such that a minimum number of cross ties 415 remain in order to keep the two tall electrode conductors 402 and 404 apart. FIG. 14 shows the conductor layout for this fourth approach. The FIG. 14A sectional view is taken through one of the cross ties 415 along a section line A–AA of FIG. 14, while the FIG. 14B sectional view along section line B–BB shows the polyimide overcoat layer 408 to be partially to completely removed. The dimensions of each dielectric cross tie region 415 can be determined from mechanical requirements, and additionally, can be used to tune the average dielectric constant for the interconnect to a desired value.

Thus, it will be appreciated by those skilled in the art that the four described approaches are simple to implement, provide improved electrical parameters including increased resonant frequency of tall electrode trace conductor interconnect array geometries. This approach thereby improves the performance of a head interconnect channel of a high speed data storage device, such as a magnetic hard disk drive or tape drive.

Although the present invention has been described in terms of the presently preferred embodiments of trace arrays for interconnecting read elements with respective read preamplifier circuits in a manner increasing resonant frequency of the array, and reduction in degradation of high speed signals, it should be clear to those skilled in the art that the present invention may also be utilized in conjunction with, for example, other trace interconnect arrays and storage devices, whether disk or tape, and whether magnetic or optical. Thus, it should be understood that the instant disclosure is not to be interpreted as limiting. Various alterations, adaptations, and modifications will no doubt become apparent to those skilled in the art after having read the above disclosure. Accordingly, it is intended that the appended claims be interpreted as covering all such alterations, adaptations and modifications as fall within the true spirit and scope of the invention.

What is claimed is:

1. A disk drive comprising:
    a head suspension assembly;
    a data transducer that is supported by the head suspension assembly;
    a drive circuitry; and
    a trace interconnect array including (i) a support substrate positioned near the head suspension assembly, (ii) a pair of trace conductors that extend between the data transducer and the drive circuitry, the trace conductors including a height and a conductor base having a width, the conductor base being secured to the support substrate, the trace conductors defining an air-dielectric space therebetween, wherein for at least a portion of each trace conductor, the ratio of the height of each trace conductor to the width of each trace conductor at the conductor base is at least approximately 3:1, and (iii) a support structure secured along at least a portion of the height of at least one of the trace conductors, the support structure inhibiting contact between the trace conductors.

2. The disk drive of claim 1 wherein the support structure is positioned substantially between the trace conductors.

3. The disk drive of claim 2 wherein the support structure has a height that is less than the height of at least one of the trace conductors.

4. The disk drive of claim 2 wherein the support structure is selectively formed to fill only a portion of the space between the trace conductors.

5. The disk drive of claim 1 wherein the support structure is formed from a dielectric material.

6. The disk drive of claim 1 wherein the distance between the trace conductors is less than the width at the conductor base of each trace conductor.

7. The disk drive of claim 1 wherein the support structure includes a plurality of spaced apart cross-tie portions positioned directly between the trace conductors.

8. The disk drive of claim 1 wherein the trace conductors each have adjacent, facing walls and non-adjacent exterior walls, and wherein the support structure is positioned adjacent to one of the exterior walls.

9. The disk drive of claim 1 wherein the support structure includes a pair of buttress support walls that are positioned so that the trace conductors are between the buttress support walls.

10. The disk drive of claim 9 wherein the buttress support walls have a height that is less than the height of at least one of the trace conductors.

11. The disk drive of claim 9 wherein at least one of the buttress support walls is formed from a dielectric material.

12. The disk drive of claim 9 wherein at least one of the trace conductors includes a lateral extension portion that extends substantially outwardly over at least approximately 20 percent of the width of one of the buttress support walls.

13. The disk drive of claim 1 wherein for at least a portion of each trace conductor, the ratio of the height of the trace conductor to the width at the conductor base is at least approximately 5:1.

14. The disk drive of claim 1, wherein for each trace conductor, the ratio of the height of each trace conductor to the width of each trace conductor at the conductor base is at least approximately 5:1.

15. The disk drive of claim 1 wherein the support structure has a height that is less than the height of at least one of the trace conductors.

16. A disk drive comprising:
    a head suspension assembly;
    a data transducer that is supported by the head suspension assembly;
    a drive circuitry; and
    a trace interconnect array including (i) a support substrate positioned near the head suspension assembly, (ii) a pair of trace conductors that extend between the data transducer and the drive circuitry, the trace conductors including a height and a conductor base having a width, the conductor base being secured to the support substrate, the trace conductors defining an air-dielectric space therebetween, wherein for each trace conductor, the ratio of the height of each trace conductor to the width of each trace conductor at the conductor base is at least approximately 3:1, and (iii) a support structure secured along at least a portion of the height of at least one of the trace conductors, the support structure inhibiting contact between the trace conductors.

17. The disk drive of claim 16 wherein the support structure is positioned substantially between the trace conductors.

18. The disk drive of claim 16 wherein the support structure has a height that is less than the height of at least one of the trace conductors.

19. The disk drive of claim 16 further comprising a pair of buttress support walls that inhibit contact between the trace conductors, wherein the trace conductors are positioned substantially between the buttress support walls.

20. The disk drive of claim 19 wherein at least one of the buttress support walls is formed from a dielectric material.

21. The disk drive of claim 19 wherein the buttress support walls have a height that is less than the height of at least one of the trace conductors.

22. A method for transporting electrical signals between a drive circuitry and a data transducer of a disk drive, the method comprising the steps of:
    positioning a pair of trace conductors on a support substrate, the trace conductors have a height and a conductor base having a width, and the ratio of the height of each trace conductor to the width of each trace conductor at the conductor base is at least approximately 3:1; and
    securing a support structure along at least a portion of the height of at least one of the trace conductors to inhibit contact between the trace conductors, the support structure allowing for an air-dielectric space between the trace conductors.

23. The method of claim 22 wherein the step of securing the support structure includes positioning the support structure substantially between trace conductors.

24. The method of claim 22 wherein the step of securing the support structure includes positioning a pair of buttress support walls so that the pair of trace conductors is substantially between the buttress support walls.

25. The method of claim 24 wherein the step of forming the pair of trace conductors includes forming one of the trace conductors with a lateral extension portion that extends substantially outwardly over at least approximately 20 percent of the width of one of the buttress support walls.

26. The method of claim 22 wherein the step of forming the pair of trace conductors includes forming the pair of trace conductors so that the ratio of the height of each trace conductor to the width of each trace conductor at the conductor base is at least approximately 5:1.

27. The method of claim 22 wherein the step of securing the support structure includes positioning the support structure so that the support structure has a height that is less than the height of at least one of the trace conductors.

* * * * *